(12) United States Patent
Lin et al.

(10) Patent No.: US 6,449,191 B1
(45) Date of Patent: Sep. 10, 2002

(54) CURRENT-MODE SENSE AMPLIFIER WITH LOW POWER CONSUMPTION

(75) Inventors: Hong-Chin Lin, Taipei; Fu-Nian Liang, Lu-Chou; Ching-Yuan Lin, Hsin-Chu Hsien, all of (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/063,137

(22) Filed: Mar. 25, 2002

(51) Int. Cl.$^7$ .............................................. G11C 16/06
(52) U.S. Cl. ................... 365/185.21; 207/205
(58) Field of Search ........................... 365/185.21, 207, 365/185.2, 205, 189.07, 189.09, 233, 185.33

(56) References Cited

U.S. PATENT DOCUMENTS 6,191,977 B1 * 2/2001 Lee ...................... 365/185.03

* cited by examiner

Primary Examiner—David Lam
(74) Attorney, Agent, or Firm—Winston Hsu

(57) ABSTRACT

A current-mode sense amplifier for detecting data stored in a flash memory cell. The sense amplifier has a first current generator for generating a first current to a first circuit according to current flowing out of the memory cell, a second current generator for generating a second current to a second circuit according to current flowing out of a reference cell, and a switch. When the switch is on and a common node of the first circuit and the second circuit is floating, the first and second circuits will generate equal initial voltages. When the switch is off and the common node of the first and second circuits is grounded, one of the initial voltages will increase, and the other initial voltage will decrease.

4 Claims, 8 Drawing Sheets

CURRENT-MODE SENSE AMPLIFIER WITH LOW POWER CONSUMPTION

BACKGROUND OF INVENTION

1. Field of the Invention

The present invention relates to a current-mode sense amplifier used in a flash memory, and more specifically, the present invention discloses a current-mode sense amplifier with lower power consumption operated under low supply voltage.

2. Description of the Prior Art

In recent years, technology and applications of flash memory have gradually been developed along with requirements of portable electronic products. These portable electronic products comprise film of a digital camera, a handheld electric device, a memory of a video game apparatus, a personal digital assistant (PDA), a telephone recorder, and a programmable IC, etc. Flash memory is a non-volatile memory, in which an operating principle is to control a switch of a gate channel to achieve an objective of memorizing data via changing a threshold voltage of a transistor or a memory cell so as to prevent data stored in the memory from disappearing due to disconnection with a power supply.

In general, the flash memory mainly comprises a floating gate for storing electric charges, and a control gate disposed on the floating gate for controlling access of data, where the control gate is separated from the floating gate via a dielectric layer formed by an oxide-nitride-oxide (ONO) structure. Therefore, the memory can utilize a principle of thermal electrons or tunneling to store induced electric charges within the overlapped gates so as to store a signal "0" in the memory. If data stored in the memory needs be changed, the only process is to supply a small extra amount of energy to remove electrons stored in the floating gate so as to rewrite data.

To access states of each memory cell in the memory, a sense amplifier is used to detect the induced electric charges stored in the memory cells so as to determine a value "0" or "1" that the memory cells represent. In general, the sense amplifier divides into a voltage mode and a current mode according to detecting types. For example, when a flash memory operates under a low voltage, the sense amplifier with the voltage mode cannot operate normally in such low voltage situations due to lower voltage swings. Therefore, the sense amplifier cannot exactly determine the storing state of the induced charges stored in the memory cells. Nevertheless, the sense amplifier using the current mode can be operated in the flash memory under the low voltage. The sense amplifier can obtain the storing state of the induced electric charges stored in the memory cells through an influence of current variance vs. voltage.

Please refer to FIG. 1. FIG. 1 is a circuit diagram of a current-mode sense amplifier 10 of a flash memory according to the prior art. The sense amplifier 10 comprises a signal generator 11 for inputting pulses, an output terminal 13 for outputting signals displayed in binary digits, two input circuits 12 and 14 respectively connected to a reference cell 16 and a memory cell 18, a differential amplifier 20 for generating an output signal according to two different input signals, a voltage source Vdd for providing operating bias voltage of the sense amplifier 10, and another differential amplifier 22 for processing currents outputted from the reference cell 16 and the memory cell 18 and generating corresponding voltage variance at two terminals A and B.

The input circuits 12 and 14 both comprise two control switches S1 and S2 for controlling on/off states of the input circuits 12 and 14. A transistor 24 and a transistor 26 of the differential amplifier 22 form a current mirror. Therefore, a current flowing out of the reference cell 16 generates a current with the same value in the differential amplifier 22 via flowing through the current mirror. Similarly, a transistor 28 and a transistor 30 of the differential amplifier 22 also form a current mirror. Therefore, a current flowing out of the memory cell 18 generates a current with the same value in the differential amplifier 22 via flowing through the current mirror.

If the voltage source Vdd provides 1.8 volts functioning as the operating bias voltage, and when the signal generator 11 inputs a signal that is at a high voltage level, the transistors 32 and 34 are on. Therefore, voltages of terminals A and B will approach ground voltage so that an output voltage generated from the differential amplifier 20 will reset to the ground voltage due to the equal voltage between the two terminals A and B.

When the signal generator 11 inputs at a low voltage level, the transistors 32 and 34 are off. Furthermore, when the control switches S1 and S2 are on and the input circuits 12 and 14 are thus formed passageways, the current flowing out of the input circuit 12 will flow into the differential amplifier 22 via passing through the current mirror formed by the transistors 26 and 24. Similarly, the current flowing out of the input circuit 14 will flow into the differential amplifier 22 via passing through the current mirror formed by the transistors 28 and 30.

If the current generated from the input circuit 12 is smaller than the current generated from the input circuit 14, an increasing rate of the voltage at terminal A will be larger than increasing rate of the voltage at terminal B. Therefore, when the voltage at terminal A reaches a threshold value so as to switch a transistor 33 on, the voltage at terminal B still does not reach a threshold value of a transistor 35 yet. Then, the transistor 33 will be on so as to decrease the voltage at terminal B and to be limited under the ground voltage, and the transistor 35 remains in a closed state so as to cause the voltage of terminal A to be larger than the voltage of terminal B. Finally, the differential amplifier 20 enhancing the voltage swing will generate an output voltage, which is near to that of the voltage source Vdd.

Similarly, if the current generated from the input circuit 12 is larger than the current generated from the input circuit 14, the differential amplifier 20 will generate an output voltage that is near to the ground voltage. When the sense amplifier 10 operates, terminals A and B use the ground voltage functioning as the threshold value to be smoothly increased. When the transistor 32 or 34 reaches the threshold value, one end of terminals A and B will be limited by the ground voltage and be decreased.

The other terminal of terminals A and B must continuously provide current so as to increase the voltage to approach the voltage source Vdd. Therefore, the prior current-mode sense amplifier 10 needs more energy to operate, thus power consumption of the sense amplifier 10 is larger.

SUMMARY OF INVENTION

It is therefore a primary objective of the claimed invention to provide a current-mode sense amplifier of a flash memory for operating in a low-voltage situation so as to consume less power to solve the aforementioned problems.

The claimed invention, briefly summarized, discloses a current-mode sense amplifier for detecting data stored in a flash memory cell. The sense amplifier has a first current generator for generating a first current to a first circuit according to current flowing out of the memory cell, a second current generator for generating a second current to a second circuit according to current flowing out of a reference cell, and a switch. When the switch is on and a common node of the first circuit and the second circuit is floating, the first and second circuits will generate equal initial voltages. When the switch is off and the common node of the first and second circuits is grounded, one of the initial voltages will increase, and the other initial voltage will decrease.

It is an advantage of the claimed invention that before the claimed current-mode sense amplifier of the flash memory initiates the output circuit to detect currents of the memory cell and the reference cell, electric potential of two terminals of the output circuit will be increased to a predetermined level. Then, when detecting the currents of the memory cell and the reference cell, the electric potential of two terminals are respectively increased and decreased to a high voltage level and a low voltage level using the predetermined level as a threshold value so as to reduce power consumption substantially.

These and other objectives and advantages of the claimed invention will no doubt become obvious to those of ordinary skill in the art after reading the following detailed description of the preferred embodiment that is illustrated in the various figures and drawings.

DETAILED DESCRIPTION

Figure 1:
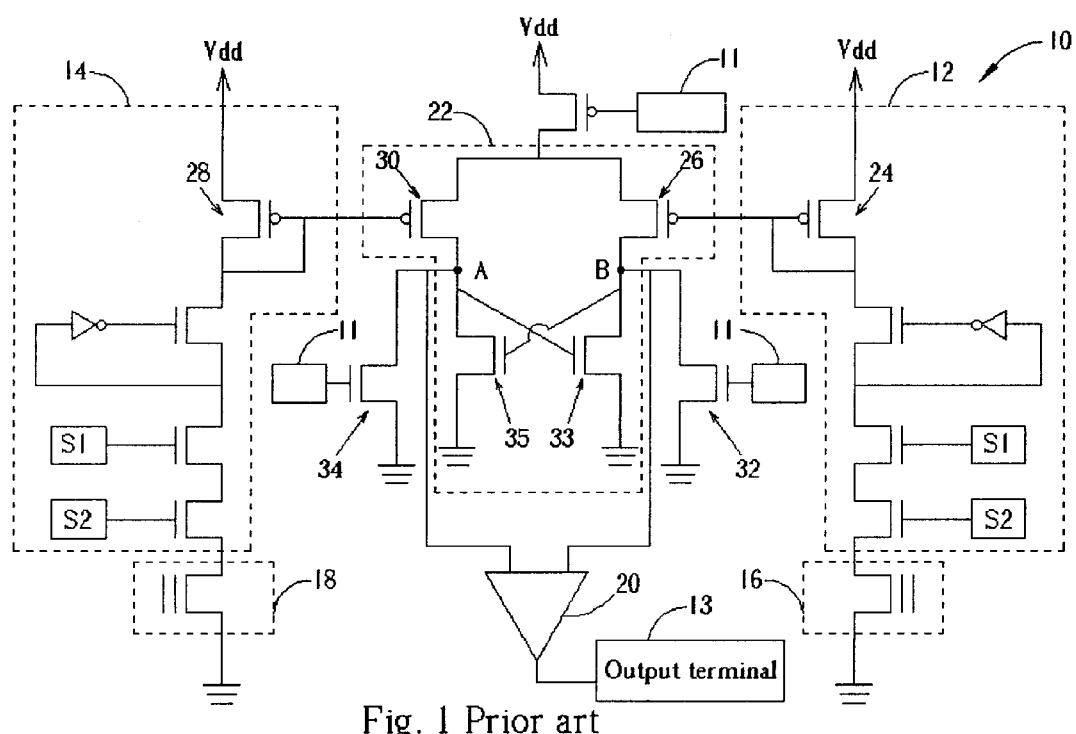
FIG. 1 is a circuit diagram of a current-mode sense amplifier of a flash memory according to the prior art.
Figure 2:
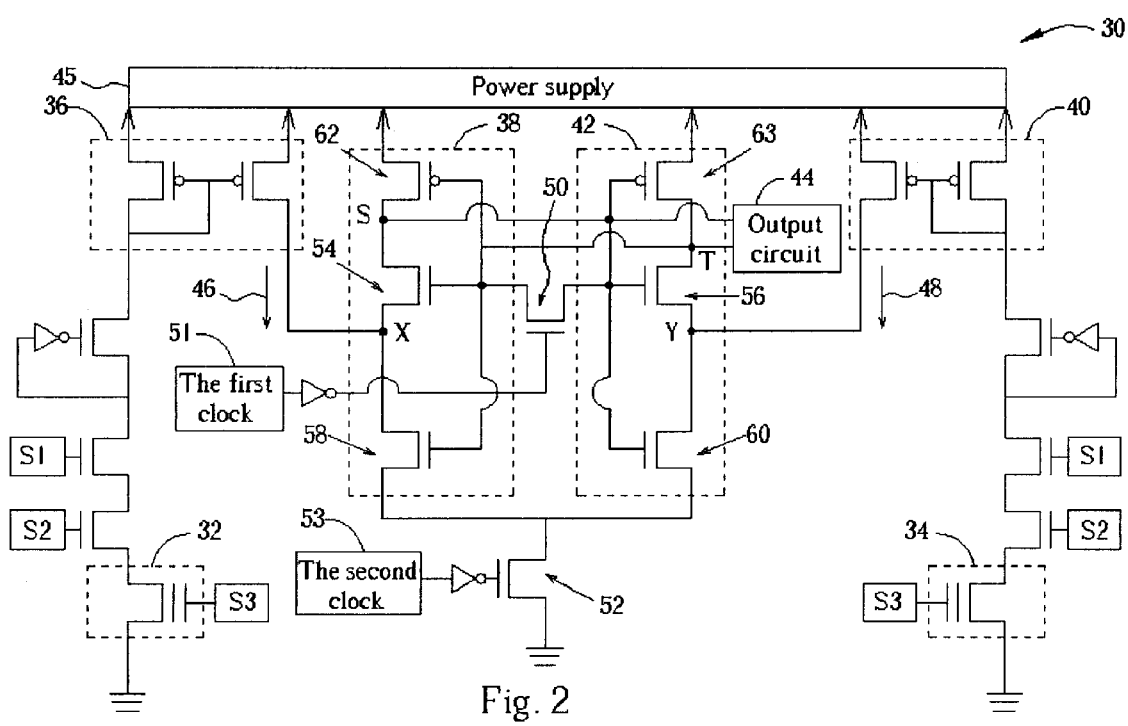
FIG. 2 is a circuit diagram of a current-mode sense amplifier of a flash memory according to the first embodiment of the present invention.

Please refer to FIG. 2. FIG. 2 is a circuit diagram of a current-mode sense amplifier 30 of a flash memory according to the first embodiment of the present invention. The sense amplifier 30 is used to detect a binary digital value displayed by a memory cell 32 according to the memory cell 32 and a reference cell 34. As shown in FIG. 2, the current-mode sense amplifier 30 comprises a first current mirror 36, a first circuit 38, a second current mirror 40, a second circuit 42, an output circuit 44, and a power supply 45.

The first circuit 38 is a symmetrical circuit with the second circuit 42. That is, connecting manners and standards of component elements within the first circuit 38 are the same as the second circuit 42. Additionally, a transistor 50 is used to connect the first circuit 38 and the second circuit 42, and to control on/off states of the first circuit 38 and the second circuit 42 through a first clock 51. When the transistor 50 is on, electric potential of a terminal S in the first circuit 38 will eventually approach electric potential of a terminal T in the second circuit 42. Another transistor 52 is connected between one end of the first circuit 38 and the second circuit 42 for controlling on/off states through a second clock 53 so as to determine if the first circuit 38 and the second circuit 42 are connected to a ground voltage. Switches S1, S2 and S3 are used to control if the memory cell 32 and the first current mirror 36 form a current transmission path, and to further control if the reference cell 34 and the second current mirror 40 form another current transmission path. When the memory cell 32 and the first current mirror 36 form an on-state path, current generated from the memory cell 32 will generate a first current 46 to flow into the first circuit 38 through the first current mirror 36. Similarly, when the reference cell 34 and the second current mirror 36 form an on-state path, current generated from the reference cell 34 will generate a second current 48 to flow into the second circuit 42 through the second current mirror 40. The detailed operation of the current-mode sense amplifier 30 of the present flash memory is illustrated as follows.

Figure 3:
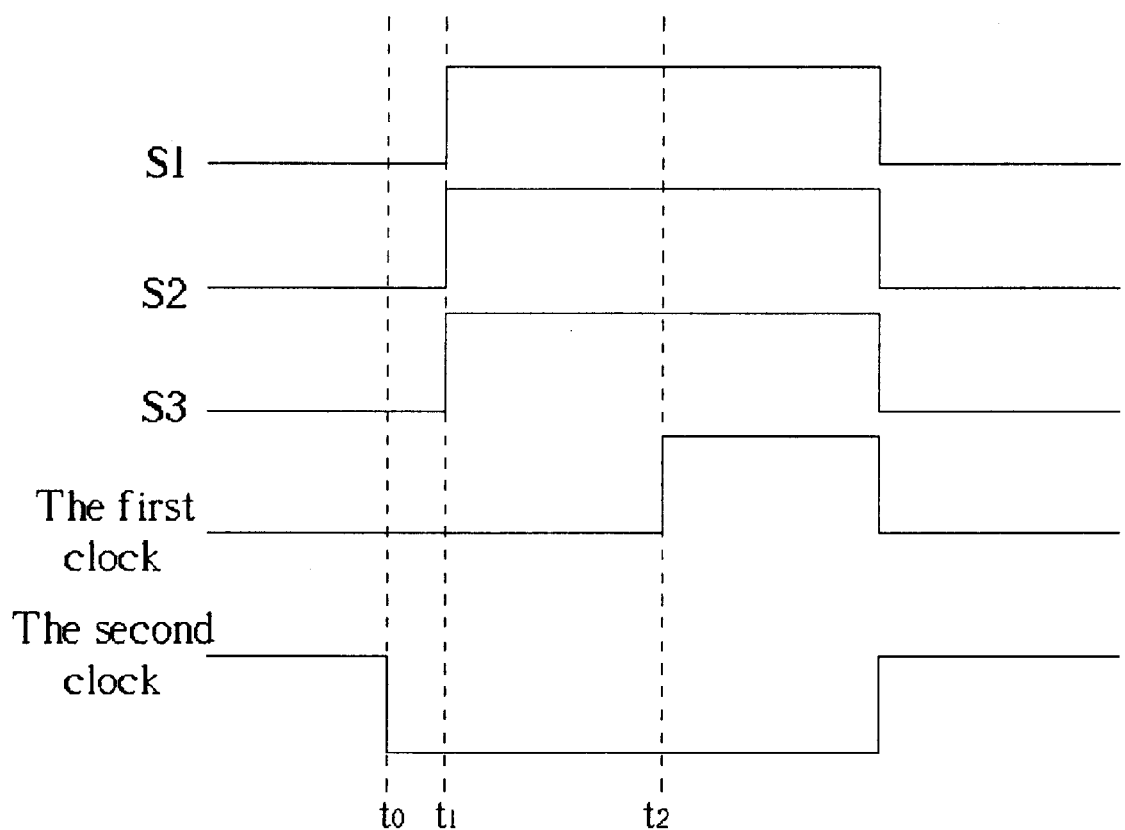
FIG. 3 is a timing diagram of the current-mode sense amplifier.

Please refer to FIG. 2 and FIG. 3. FIG. 3 is a timing diagram of the current-mode sense amplifier 30 depicted in FIG. 2 when the sense amplifier 30 drives. In the first preferred embodiment, the power supply 45 provides a required bias voltage (such as 1.8 volts) of the sense amplifier 30 when the sense amplifier 30 operates. Before time t0, the switches S1, S2, S3, and the first clock 51 are low, and the second clock 53 is high. Electric charges within the sense amplifier 30 will first achieve an equilibrium state, and terminals S and T can also achieve the same voltage level that is higher than the ground voltage.

At time t0, the switches S1, S2, S3, and the first clock 51 are low, and the second clock 53 is changed from high to low. The voltage levels at terminals S and T of the sense amplifier 30 will be slightly adjusted and also achieve the same voltage level that is higher than the ground voltage.

At time t1, the switches S1, S2, and S3 are changed from low to high. Therefore, the first current mirror 36 generates the corresponding first current 46 according to the current generated from the memory cell 32, and the second current mirror 40 generates the corresponding second current 48 according to the current generated from the reference cell 34. Additionally, the transistor 50 maintains the on state so as to allow terminals S and T to approach the same voltage level. Nevertheless, the transistor 52 is also on so that one of the ends of the first circuit 38 and the second circuit 42 are connected to the power supply 45, and the others are connected to the ground voltage. At this time, transistors 54 and 62 of the first circuit 38 and transistors 56 and 63 of the second circuit 42 operate in a saturation region, and a transistor 58 of the first circuit 38 and a transistor 60 of the second circuit 42 operate in a linear region. If the second current 48 is less than the first current 46, current flowing through the transistor 60 will be less than current flowing through the transistor 58. Since the transistors 58 and 60 operate in the linear region, the voltage level of a terminal X in the first circuit 38 will be larger than the voltage level of a terminal Y in the second circuit 42. Furthermore, the transistor 50 is on so that terminals S and T will approach a threshold voltage (such as 1 volt), which is larger than the ground voltage. In addition, the transistors 54 and 56 operate in the saturation region, and gate voltages of the transistors 54 and 56 approach the same voltage level due to the equal voltage level of the two terminals S and T. Nevertheless, the voltage level of terminal X is larger than the voltage level of terminal Y so that source voltage of the transistor 54 will be larger than source voltage of the transistor 56 so as to cause current flowing through the transistor 54 to be smaller than current flowing through the transistor 56. As mentioned above, before time t2, the voltage levels of terminals S and T will approach the same level due to the on state of the transistor 50.

At time t2, the first clock is changed from low to high, the switches 51, S2 and S3 still remain in the high level, and the second clock 53 still remains in the low level. Therefore, the first current mirror 36 generates the first current 46 according to current generated from the memory cell 32 and flows into the first circuit 38, and the second current mirror 40 generates the first current 48 according to current generated from the reference cell 34 and flows into the second circuit 42. The transistor 52 is on so that one of the ends of the first circuit 38 and the second circuit 42 will be connected to the ground voltage. As mentioned above, current flowing through the transistor 54 is smaller than current flowing through the transistor 56. Therefore, when the first clock 51 is high so as to allow the transistor 50 to be in the off state and the second clock 53 is low so as to allow the transistor 52 to be in the on state, the transistor 56 will permit the voltage level of terminal T in the second circuit 42 to be slightly decreased. Similarly, the transistor 54 will also permit the voltage level of terminal S in the first circuit 38 to be slightly increased. When the voltage level of terminal T continuously decreases to eventually allow the transistor 62 to be in the on state, the voltage level of terminal S will be increased to approach the required operating voltage of the sense amplifier 30 provided by the power supply 45, and to further increase the gate voltage of the transistor 60. Therefore, the voltage level of terminal T can quickly approach the ground voltage so as to respectively allow terminals S and T to achieve the high and low voltage levels. Then, the output circuit 44 outputs an output signal to show the binary digital value represented by the memory cell 32 according to the voltage levels of terminals S and T. Similarly, if the second current 48 generated from the reference cell 34 is larger than the first current 46 generated from the memory cell 32, the voltage levels of terminals S and T are the low and high voltage levels, respectively.

Figure 4:
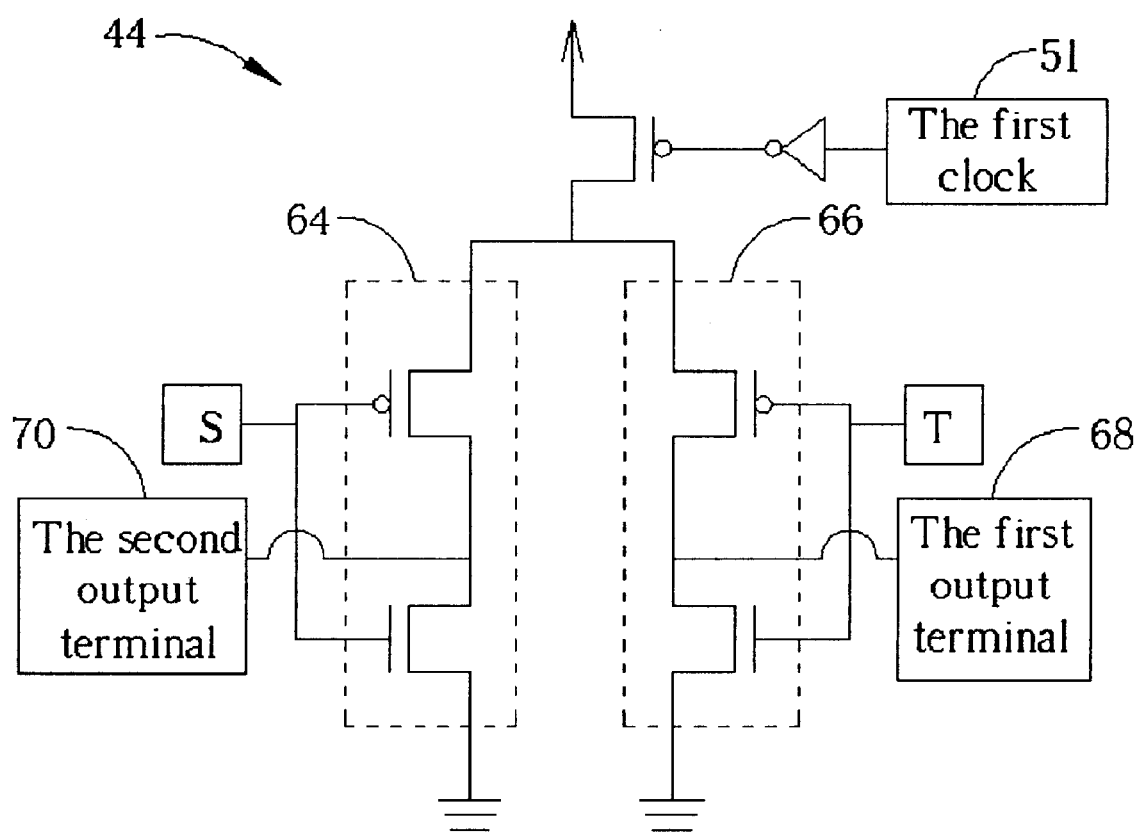
FIG. 4 is a circuit diagram of an output circuit.

Please refer to FIG. 2 and FIG. 4. FIG. 4 is a circuit diagram of the output circuit 44 depicted in FIG. 2. As shown in FIG. 4, the output circuit 44 comprises two complementary metal-oxide semiconductor (CMOS) transistors 64 and 66. The gates of the transistors 64 are connected to terminal S of the first circuit 38, and the gates of the transistors 66 are connected to terminal T of the second circuit 42. When the first clock 51 inputs a signal of a high voltage level, the output circuit 44 can thus be initiated so as to allow inverters composed of the transistors 64 and 66 to act. When terminal S is in the high voltage level and terminal T is in the low voltage level, a first output terminal 68 will output the high voltage level, and a second terminal 70 will output the low voltage level. Oppositely, when terminal S is in the low voltage level and terminal T is in the high voltage level, the first output terminal 68 will output the low voltage level, and the second terminal 70 will output the high voltage level. Therefore, the present invention can determine the binary digital value represented by the memory cell 32 according to the first output terminal 68 or the second output terminal 70. For example, if the first current 46 is larger than the second current 48, terminal S is in the high voltage level and terminal T is in the low voltage level so that the first output terminal 68 of the output circuit 44 will output the high voltage level. That is, the binary digital value represented by the memory cell 32 is "1". If the first current 46 is smaller than the second current 48, terminal S is in the low voltage level and terminal T is in the high voltage level so that the first output terminal 68 of the output circuit 44 will output the low voltage level. That is, the binary digital value represented by the memory cell 32 is "0". In the first embodiment, the output circuit 44 utilizes two inverters composed by the transistors 64 and 66 to perform a corresponding process to the first current 46 and the second current 48. Nevertheless, a differential amplifier can also be used to perform the corresponding process to the first current 46 and the second current 48. Furthermore, the memory cell 32 is connected to the first circuit 38 via the first current mirror 36. Therefore, the first current 46 generated from the first current mirror is constant and not changed due to influence of the first circuit 38. Thereby, the present current-mode sense amplifier 30 can also be used in a multi-level flash memory.

Figure 5:
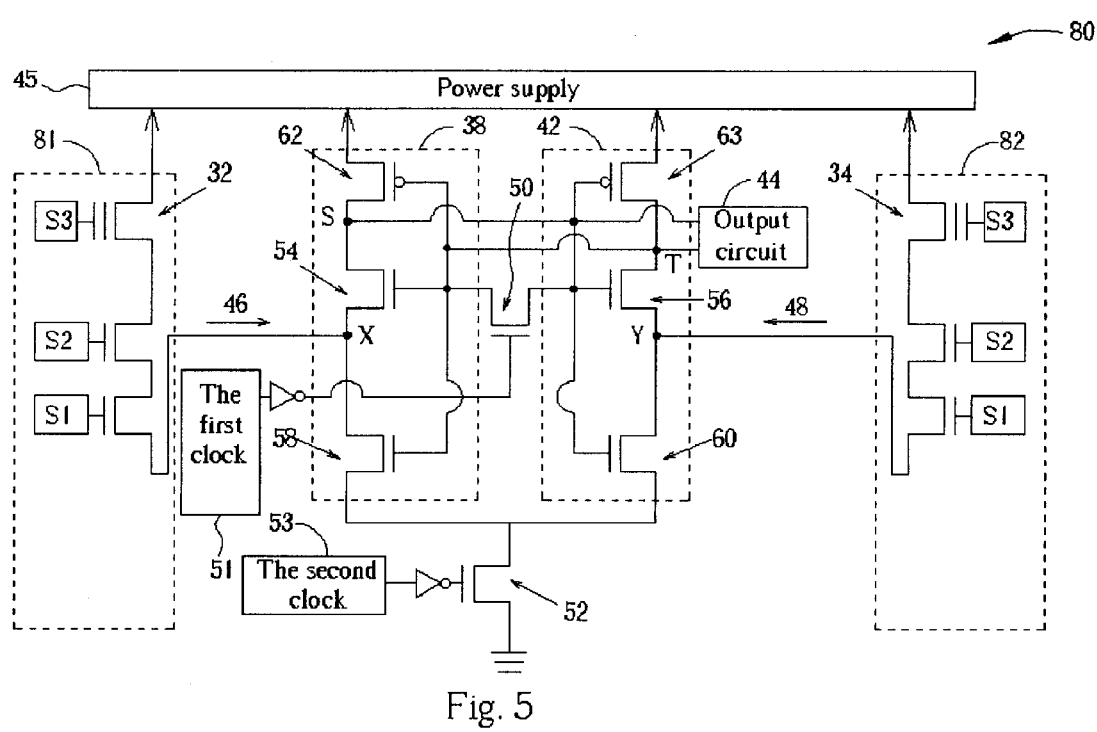
FIG. 5 is a circuit diagram of a current-mode sense amplifier of the flash memory according to the second embodiment of the present invention.

Please refer to FIG. 5. FIG. 5 is a circuit diagram of a current-mode sense amplifier 80 of the flash memory according to the second embodiment of the present invention. The sense amplifier 30 shown in FIG. 2 utilizes current mirrors to generate the first current 46 and the second current 48. In the second preferred embodiment, the sense amplifier 80 utilizes a first current generator 81 to output the first current 46 of the memory cell 32 and a second current generator 82 to output the second current 48 of the reference cell 34. In the sense amplifier 80, the first clock 51, the second clock 53, and the driving clocks of the switches S1, S2 and 53 are the same as shown in FIG. 3, and variance of the voltage levels of terminals X, Y, S and T is the same as the sense amplifier 30 illustrated. The output circuit 44 will eventually output an output signal to show the binary digital value represented by the memory cell 32 according to the voltage levels of terminals S and T.

Figure 6:
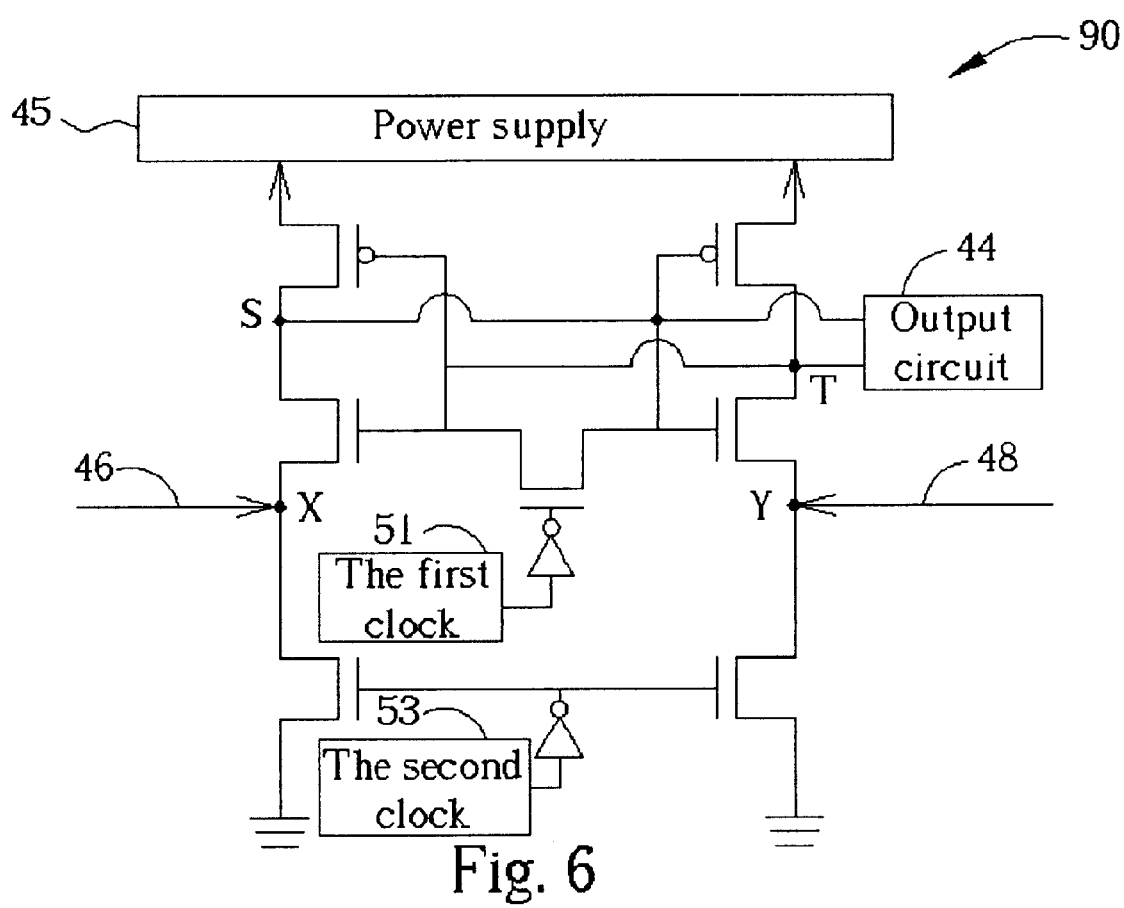
FIG. 6 is a circuit diagram of a current-mode sense amplifier of the flash memory according to the third embodiment of the present invention.
Figure 7:
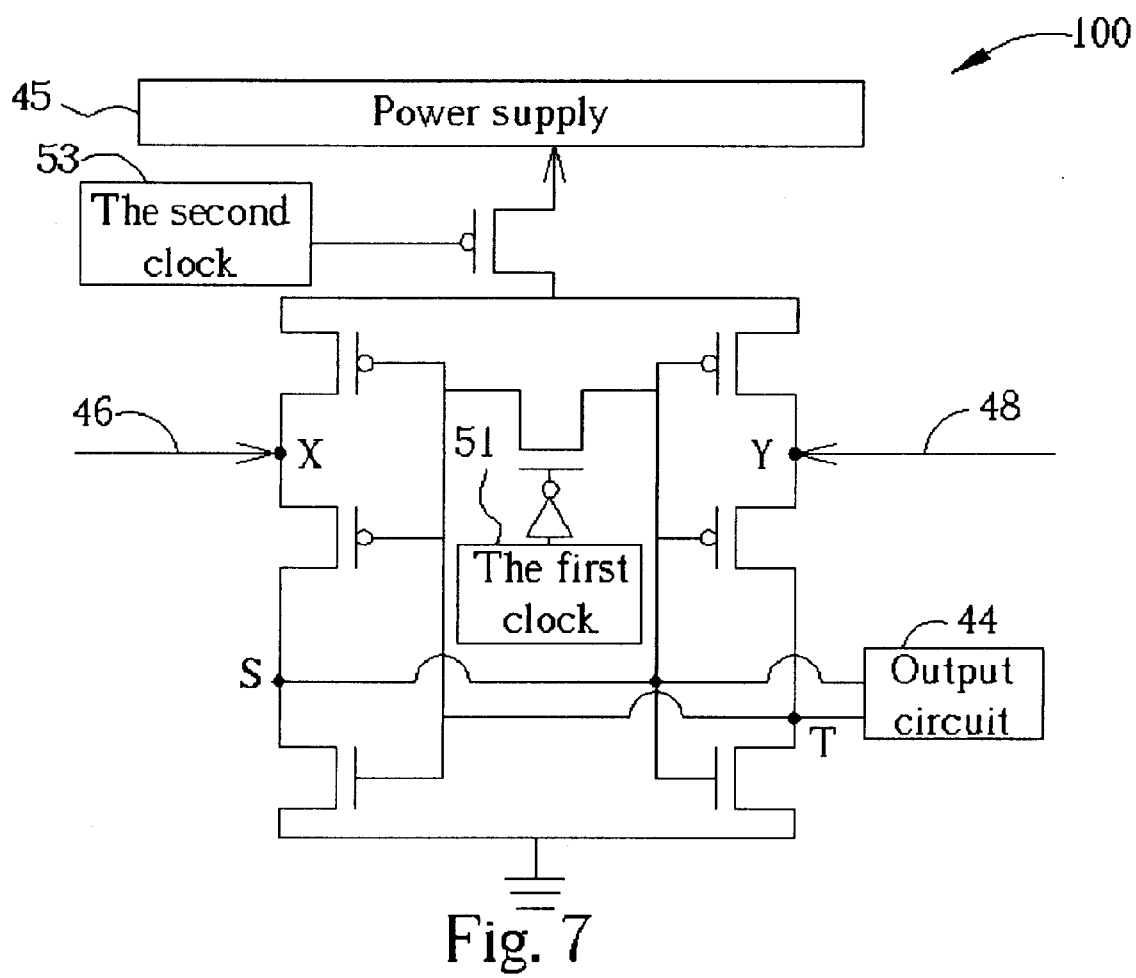
FIG. 7 is a circuit diagram of a current-mode sense amplifier of the flash memory according to the fourth embodiment of the present invention.
Figure 8:
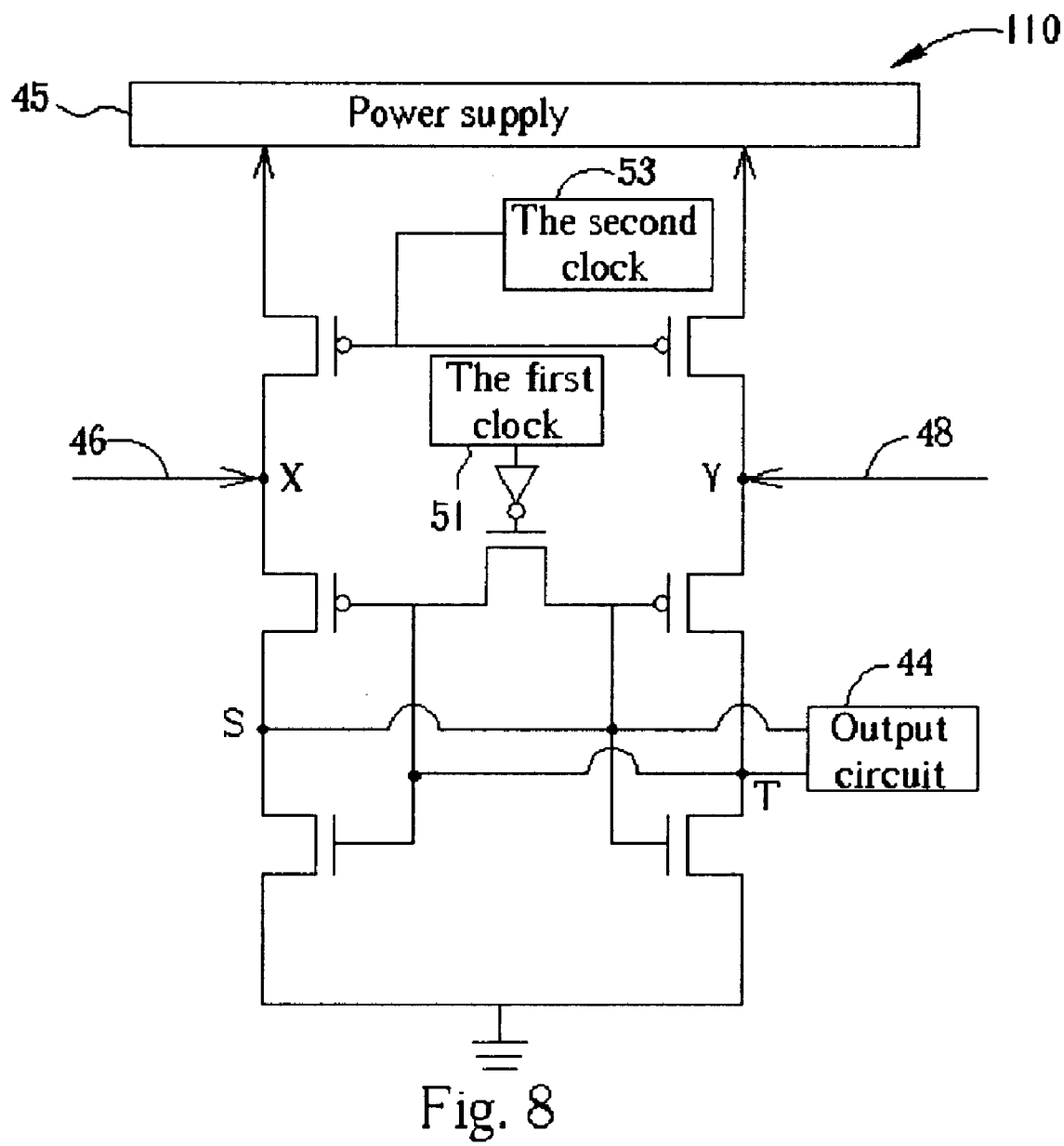
FIG. 8 is a circuit diagram of a current-mode sense amplifier of the flash memory according to the fifth embodiment of the present invention.

Please refer to FIG. 6 to FIG. 8. FIG. 6 is a circuit diagram of a current-mode sense amplifier 90 of the flash memory according to the third embodiment of the present invention. FIG. 7 is a circuit diagram of a current-mode sense amplifier 100 of the flash memory according to the fourth embodiment of the present invention. FIG. 8 is a circuit diagram of a current-mode sense amplifier 110 of the flash memory according to the fifth embodiment of the present invention. In the sense amplifiers 90, 100, and 110, the first current 46 corresponds to a memory cell (not shown) and inputs into terminal X, and the second current 48 corresponds to a reference cell (not shown) and inputs into terminal Y. The driving clocks of the first clock 51 and the second clock 53 are as shown in FIG. 3. As mentioned above, terminals S and T will generate corresponding variance according to the first current 46 and the second current 48. Similarly, the output circuit 44 will eventually output an output signal to show the binary digital value represented by the memory cell 32 according to the voltage levels of terminals S and T.

In contrast to the prior art, before the present current-mode sense amplifier of the flash memory initiates the output circuit to detect currents of the memory cell and the reference cell, electric potential of two terminals of the output circuit will be increased to a predetermined level. Then, when detecting the currents of the memory cell and the reference cell, the electric potentials of two terminals are respectively increased and decreased to a high voltage level and a low voltage level using the predetermined level as a threshold value so as to reduce power consumption substantially.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A current-mode sense amplifier of a flash memory for detecting data stored in a memory cell according to currents flowing out of the memory cell and a reference cell;

the current-mode sense amplifier comprising:

a first current generator for generating a first current according to the current flowing out of the memory cell;

a first circuit connected to the first current generator for generating a first voltage according to the first current generated from the first current generator, a first terminal of the first circuit being connected to a power supply;

a second current generator for generating a second current according to the current flowing out of the reference cell;

a second circuit connected to the second current generator for generating a second voltage according to the second current generated from the second current generator, a first terminal of the second circuit being connected to the power supply; and an output circuit connected to output terminals of the first circuit and the second circuit for generating an output signal, which relates to data stored in the memory cell, according to the first voltage and the second voltage;

wherein the first circuit is connected to the second circuit through a switch, when the switch is turned on for making a second terminal of the first circuit and a second terminal of the second circuit float, charges present within the first circuit and the second circuit distribute uniformly so that both the first voltage at the output terminal of the first circuit and the second voltage at the output terminal of the second circuit eventually approach an initial voltage, which is lower than a supply voltage generated from the power supply and is higher than a grounding voltage of a grounding terminal, and when the switch is turned off for making the second terminal of the first circuit and the second terminal of the second circuit connect to the grounding terminal, one of the first voltage and the second voltage approaches the supply voltage generated from the power supply according to the first current and the second current, and the other approaches the grounding voltage of the grounding terminal according to the first current and the second current.

2. The current-mode sense amplifier of claim 1 wherein the output circuit comprises at least a pair of inverters or at least a differential amplifier.

3. The current-mode sense amplifier of claim 1 wherein the second circuit has a circuit layout identical with a circuit layout of the first circuit.

4. The current-mode sense amplifier of claim 1 wherein the first current generator is a first current mirror for generating the first current according to the current flowing out of the memory cell and the second current generator is a second current mirror for generating the second current according to the current flowing out of the reference cell.

* * * * *